United States Patent
Melanson et al.

(10) Patent No.: US 6,693,571 B2
(45) Date of Patent: Feb. 17, 2004

(54) MODULATION OF A DIGITAL INPUT SIGNAL USING A DIGITAL SIGNAL MODULATOR AND SIGNAL SPLITTING

(75) Inventors: John L. Melanson, Austin, TX (US); Jack B. Andersen, Austin, TX (US); Michael G. Chorn, Boulder, CO (US)

(73) Assignee: Cirrus Logic, Inc., Austin, TX (US)

(*) Notice: Subject to any disclaimer, the term of this patent is extended or adjusted under 35 U.S.C. 154(b) by 0 days.

(21) Appl. No.: 10/325,145

(22) Filed: Dec. 20, 2002

(65) Prior Publication Data

US 2003/0095013 A1 May 22, 2003

Related U.S. Application Data

(63) Continuation-in-part of application No. 10/191,016, filed on Jul. 8, 2002.

(51) Int. Cl.[7] .............................................. H03M 3/00
(52) U.S. Cl. .................... 341/143; 341/144; 375/238
(58) Field of Search ............................. 341/143, 144; 330/10; 375/238

(56) References Cited

U.S. PATENT DOCUMENTS

| | | | | |
|---|---|---|---|---|
| 5,008,675 | A | * 4/1991 | Toyomaki | 341/152 |
| 5,425,061 | A | * 6/1995 | Laczko et al. | 375/371 |
| 5,657,219 | A | 8/1997 | Stanley | 363/132 |
| 5,815,102 | A | 9/1998 | Melanson | 341/143 |
| 5,994,973 | A | * 11/1999 | Toki | 332/109 |
| 6,150,969 | A | 11/2000 | Melanson | 341/143 |
| 6,304,200 | B1 | * 10/2001 | Masuda | 341/144 |
| 6,373,336 | B1 | 4/2002 | Anderskouv et al. | 330/10 |
| 6,414,614 | B1 | * 7/2002 | Melanson | 341/143 |

OTHER PUBLICATIONS

Stanley, Gerald R. and Bradshaw, Kenneth M., "Precision DC–to–DC Power Conversion by Optimization of the Output Current Waveform—The Half Bridge Revisited," IEEE Transactions on Power Electronics, vol. 14, No. 2, Mar. 1999, pp. 372–380.

"Delta Sigma A/D Conversion Technique Overview," Crystal Semiconductor Corporation, Jan. 1997, AN10REV2, pp. 1–10.

Varona, Jorge, "Power Digital–to–Analog Conversion Using Sigma–Delta and Pulse Width Modulations" ECE University of Toronto, ECE1371 Analog Electronics II, pp. 1–14, 2001.

www.crownaudio.com, BCA Operation, Behind the Scenes of the . . . Balanced Current Amplifier, Aug. 23, 2002, pp. 1–8.

www.crownaudio.com, Reinventing the Power Amplifier—BCA, Jul. 16, 2002, pp. 1–3.

* cited by examiner

*Primary Examiner*—Peguy JeanPierre
(74) *Attorney, Agent, or Firm*—Hamilton & Terrile, LLP; Kent B. Chambers

(57) ABSTRACT

A digital signal modulator modulates a digital input signal to drive a load, such as an opposed current amplifier or other opposed current converter. The combinations of frequency relationships and digital signal modulator elements provide significant digital signal processing capabilities and flexible output signal timing. In one embodiment, a digital signal modulator modulates a digital input signal. Even and odd samples of the input signal propagate along two respective channels (signal paths), which include further digital processing capabilities, such as pulse width modulation, to generate output signals appropriate for the topology of a load. Additionally, a bias signal may be modulated with the digital input signal. By utilizing digital signal processing to modulate the input signal, various processing technologies are applied to the input signal. For example, noise shaping may be implemented using a delta-sigma modulator as an input stage to the two channels.

41 Claims, 11 Drawing Sheets

MODULATION OF A DIGITAL INPUT SIGNAL USING A DIGITAL SIGNAL MODULATOR AND SIGNAL SPLITTING

CROSS-REFERENCE TO RELATED APPLICATIONS

This Application is a Continuation-In-Part of a U.S. patent application Ser. No. 10/191,016 entitled "Delta Sigma Modulation Circuits and Methods Utilizing Multiple Noise Attenuation Bands and Data Converters Using the Same," Inventor John L. Melanson, having a filing date of Jul. 8, 2002, which is hereby incorporated in its entirety by reference and referred to herein as "Melanson I."

BACKGROUND OF THE INVENTION

1. Field of the Invention

The present invention relates in general to the field of signal processing, and, more specifically, to a system and method for modulating an input signal with a digital signal modulator and splitting an output signal of the digital signal modulator into multiple output signals.

2. Description of the Related Art

Analog and digital modulators are utilized to convert analog and digital input signals into drive signals. For example, the modulators convert an input signal into discrete pulses using well-known pulse width modulation techniques. The pulses are used as drive signals. The drive signals are utilized to drive output current to a load. In an acoustic application, voice signals may be modulated to drive a load, such as audio speakers.

Power converters may be used to convert direct current (DC) to alternating current (AC) to be used as an AC power supply, or as battery chargers/dischargers, motor controls, etc. Power converters may also be used as amplifiers, both for entertainment (sound amplification) and industrial uses. Many conventional pulse width modulated (PWM) converters use a pair of switches to connect a load alternatively to DC power supplies of opposite polarity. A modulator alternately opens and closes the switches to produce a width modulated output signal that is subsequently filtered by a low pass filter before being transmitted to the load. Care must be taken to assure that both switches are not turned "on" at the same time to prevent drawing transient "shoot-through" current. Several ways to limit or prevent such shoot-through current have been used. For example, current limiting inductors may be used, or "underlap" circuits may be utilized to create small controlled time gaps between the conduction times of the switches. Opening and closing the switches creates a generally undesirable "ripple" frequency on an output waveform generated by the conventional modulator.

Opposed current converters ("OCCs") address the problem of ripple frequency generation. U.S. Pat. No. 5,657,219 entitled "Opposed Current Power Converter" by Gerald R. Stanley (referred to herein as the "Stanley patent") discloses an example of an OCC. Stanley and Bradshaw, *Precision DC-to-AC Power Conversion by Optimization of the Output Current Waveform-The Half Bridge Revisited*, IEEE Transactions on Power Electronics, Vol. 14, No. 2, March 1999 provide additional discussion on OCCs. OCCs, which include amplifiers referred to as class-I amplifiers, opposed current amplifiers, balanced current amplifiers, and opposed current interleaved amplifiers, are particularly useful in audio applications due to their high efficiency and high signal to noise ratios in frequency bandwidths of interest.

Referring to FIG. 1, the Stanley patent discloses a power converter circuit 100, which is also sometimes referred to as an opposed current amplifier stage. Power converter circuit 100 receives two input drive signals $S_p'$ and $S_n'$. Signals $S_p'$ and $S_n'$ are square-waves with pulse-widths that are determined by modulating an input signal.

Power converter circuit 100 has four states of operation in the continuous current mode. Signals $S_p'$ and $S_n'$ determine the states of operation by respectively controlling the conductivity of switches 102 and 104. Switches 102 and 104 conduct during the interval when $S_p'$ and $S_n'$ are both HIGH causing the main output inductor currents Ip and In to increase at a rate of approximately V/L, in which L=Lp=Ln and V is the magnitude of each supply voltage (Vsupply). When $S_p'$ and $S_n'$ are both HIGH, the magnetization of inductors Lp and Ln are increased. When $S_p'$ and $S_n'$ are both LOW, switches 102 and 104 become nonconductive, the inductor voltages are reversed, the diodes 108 and 110 conduct, and the inductor current magnitudes ramp down at the same rate. When $S_p'$ and $S_n'$ are both LOW, the magnetization of inductors Lp and Ln are decreased. When $S_p'$ is LOW and $S_n'$ is HIGH, switch 104 and diode 110 conduct resulting in negative output current (Iout) into output node 106. When $S_p'$ is HIGH and $S_n'$ is LOW, switch 102 and diode 108 conduct resulting in positive output current Iout from node 106.

Table 1 summarizes the four continuous current mode states of operation for power converter circuit 100 with reference to signals $S_p'$ and $S_n'$. Table 1 uses "HIGH" and "LOW" to represent the states of signals $S_p'$ and $S_n'$. In the embodiment of FIG. 1, a HIGH signal causes switches 102 and 104 to conduct, and a LOW signal causes switches 102 and 104 to open.

TABLE 1

| $S_p'$ | $S_n'$ | Power Converter Circuit 100 Current Mode States |
| --- | --- | --- |
| LOW | LOW | Demagnetizing |
| LOW | HIGH | Negative Output Current |
| HIGH | LOW | Positive Output Current |
| HIGH | HIGH | Magnetizing |

Referring to FIG. 2, the Stanley patent describes an analog modulator 200 utilized to produce signals $S_p'$ and $S_n'$ for drive power converter circuit 100. Analog modulator 200 utilizes an error amplifier 202 to generate an error signal 204 from an input signal 206, representing a desired level at output node 106 of power converter circuit 100, and a feedback signal 208 received from output node 106. Inverter 218 inverts error signal 204 to generate inverse error signal 216. Comparators 210 and 214 generate respective signals $S_p'$ and $S_n'$ by comparing a triangle waveform 212 with respective error signal 204 and inverse error signal 216. Signal $S_p'$ is HIGH when the magnitude of triangle waveform 212 exceeds error signal 204, and signal $S_p'$ is LOW when the magnitude of error signal 204 exceeds triangle waveform 212. Likewise, signal $S_n'$ is HIGH when the magnitude of triangle waveform 212 exceeds inverse error signal 216, and signal $S_n'$ is LOW when the magnitude of inverse error signal 214 exceeds triangle waveform 212.

For example, the triangle waveform 212 is also biased to address cross-over distortion during the switching of switches 102 and 104. Triangle waveform generator 220 generates triangle waveform 212 from a square wave input signal 222. The direct current (DC) level of the triangle waveform 212 is adjusted by adding or subtracting bias signal 224 from triangle waveform 212. The bias is normally adjusted such that, at input signal equal zero, both switches are on slightly more than fifty percent (50%) of the time, and an idle current exists in the inductors Ln and Lp which keeps the diodes 108 and 110 clamped during the de-magnetization phase.

Referring to FIG. 3, U.S. Pat. No. 6,373,336, entitled Method of Attenuating Zero Crossing Distortion and Noise in an Amplifier, an Amplifier and Uses of the Method and the Amplifier, inventors Niels Anderskouv and Lars Risbo, (referred to herein as the "Anderskouv-Risbo patent") describes an example of an amplifier 300 using dual pulse width modulators, PWM A and B, to drive respective half bridge amplifiers A and B connected to load 302. A signal source 304 provides an input signal to inverting block 306 and noninverting block 308. PWM A provides one output signal to drive the switches of Half bridge A, and PWM B provides one output signal to drive the switches of Half bridge B. The Anderskouv-Risbo patent introduces a delay element AT into the signal path between PWM B and half bridge B to prevent simultaneous switching of switches on the half bridges A and B and, thus, attenuate cross-over distortion. The Anderskouv-Risbo patent does not teach providing appropriate signals to drive switches separately within a half bridge amplifier such as power converter circuit 100. In contrast, the Stanley patent teaches switching techniques for use within a half bridge. Two copies of the Stanley circuit could be used for creating a full bridge circuit.

For example, the Anderskouv-Risbo patent and other references do not address the application of digital signal processing technology to provide appropriate input signals to loads such as power converter circuit 100.

SUMMARY OF THE INVENTION

In embodiments of the present invention, a digital input signal is modulated using a digital signal modulator to provide multiple signals to drive a load, such as an opposed current converter (OCC).

In one embodiment of the present invention, an apparatus includes a first digital signal modulator to generate a first modulated output signal derived from a digital input signal. First duty cycle circuitry, coupled to the first digital signal modulator, to receive first and second input signals, which are respective subsets of samples of the first modulated output signal. The first duty cycle circuitry responds to the first and second input signals and respectively generates a first output signal and a second output signal. In one embodiment, the first digital signal modulator includes a delta-sigma modulator, and the first duty cycle circuitry includes two pulse width modulators. During operation of the first digital signal modulator and the first duty cycle circuitry, a duty cycle of the first output signal has a direct relationship to change in the digital input signal, a duty cycle of the second output signal has an inverse relationship to change in the digital input signal. The first and second output signals of the second circuitry are suitable for driving an opposed current converter stage.

In another embodiment of the present invention, a method of providing multiple output drive signals derived from a common input signal includes receiving a common digital input signal and a first digital bias signal. The common input signal is a digital audio signal, and the first digital bias signal is derived from even numbered samples of a bias signal. The method further includes converting the common digital input signal and the first digital bias signal into a first output signal using a first modulator. The method also includes receiving the common digital input signal and a second digital bias signal and converting the common digital input signal and the second digital bias signal into a second output signal using the first modulator. The second digital bias signal is derived from odd numbered samples of the bias signal. The method further includes providing the first and second output signals to circuitry operable to derive a drive signal from the first and second output signals. In one embodiment, the drive signal is derived by using the first and second output signals to generate the drive signal of an opposed current converter.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Signals may be generally processed through utilizing digital signal processing technology and mixed signal (analog and digital) technology. For example, audio signals are often digitized, processed, and converted back into analog signals to produce sound through a loud speaker. Amplifiers utilizing multiple drive signal inputs, such as OCCs, are particularly useful for audio applications due to their low noise output when receiving an audio input signal at a zero or near zero level (representing silence or low volume audio input).

The signal processing systems disclosed herein include a digital signal modulator capable of receiving a digital input signal, such as an audio digital signal, and providing multiple, modulated output signals. The signal processing systems are in some embodiments characterized as a digital to analog converter system when the output signals are utilized to drive loads, such as OCCs, and the loads provide an analog representation of a digital input signal.

Additionally, digital signal processing affords opportunities for implementing digital signal processing techniques, such as noise shaping and generation of one or more noise attenuation bands.

Figure 4:
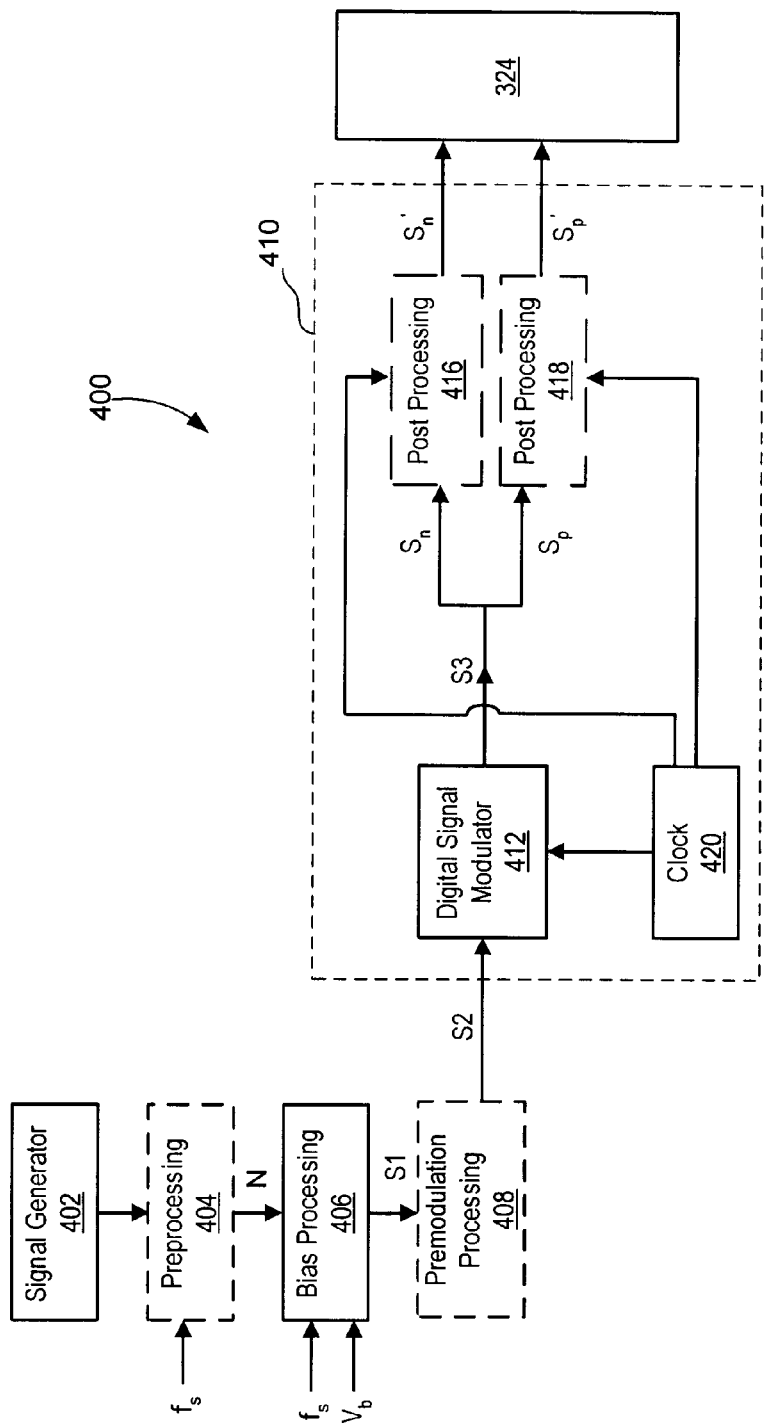
FIG. 4 depicts a digital signal processing system for providing multiple modulated signals derived from a single input signal.

FIG. 4 depicts one embodiment of a digital signal processing system capable of modulating an input signal, which may be biased, and generating multiple output signals. The output signals are useful to drive opposed current converters ("OCCs"). FIG. 4 depicts digital signal processing system 400 having a signal generator 402, which, for example, is a microphone capable of producing an electronic signal in response to audio sound waves and analog to digital sampling technology to convert the microphone output signal into a digital signal. The digital signal processing system 400 also generally includes well-known signal preprocessing components 404 such as a register, low pass filter, and linear interpolator. U.S. Pat. No. 5,815,102, entitled Delta Sigma PWM DAC to Reduce Switching, inventor John L. Melanson, (referred to herein as "Melanson II") describes examples of such preprocessing components in the text referencing FIG. 4 in Melanson II. Melanson II is hereby incorporated by reference in its entirety. Preprocessing components 404 produce an input signal N. The digital signal processing system 400 utilizes bias processing system 406 to modify input signal N with bias signal $V_b$. As described in more detail below, depending on the embodiment, digital signal processing system 400 may complement signal N and/or bias signal $V_b$ to generate output signal S1. Switches in amplifiers, such as the power converter circuit 100, transition between open and close to control the power supplied by the amplifier. Well-known nonlinearities, such as zero current cross-over distortion, in output current Iout occur due to the timing of switching cycles. Bias signal $V_b$ is generally set in a range that is high enough to minimize such nonlinearities and low enough to minimize voltage swing reductions.

Signal S1 is further processed by premodulation processing component 408 prior to being modulated by digital signal modulation system 410. Premodulation processing component 408 includes well-known linear interpolators to increase the sample rate of signal S1 to generate signal S2, which may be separate signals or composite signals as further described below.

The digital signal modulation system 410 modulates signal S2 with digital signal modulator 412. Signal S3 consists of X output samples from digital signal modulator 412, where X is the total number of output samples from digital signal modulation system 410. Signal S3 may thus be divided into multiple groups of signals, such as signal $S_n$ and signal $S_p$. In one embodiment, signal $S_n$ represents even numbered samples of signal S3, and signal $S_p$ represents odd numbered samples of signal S3. In one embodiment, clock 420 provides interleaved clock signals of the same frequency to post processing components 416 and 418. If the interleaved clock signal frequency is one-half the frequency provided to digital signal modulator 412, then post processing component 416 processes one-half of the signal S3 samples, and post processing component 418 processes the other half. The interleaved clock signals may be initiated so that signals $S_n$ and $S_p$ represent the even and odd samples, respectively. Thus, in one embodiment, although all samples of signal S3 are presented to post processing components 416 and 418, each post processing component processes one-half of the signal S3 samples. Post processing components 416 and 418 generate signals $S_n'$ and $S_p'$. Post processing components 416 and 418 may include well-known components, such as level shifters, inverters, and delay elements. Signals $S_n'$ and $S_p'$ drive load 324. Load 324 is, for example, an OCC such as power converter circuit 100.

The digital signal modulation system 410 utilizes clock 420 to provide the clock signals used by digital signal processing system 400. Clock 420 may be implemented as one or more clocks and may provide a variety of clock signals to digital signal modulation system 410 for use by multiple components. As discussed in more detail below, the clock signals provided to various components of digital signal processing system 400 may be in-phase with each other.

Digital signal modulation system 410, in some embodiments, utilizes technology to address noise and other issues that arise during the processing of input signal N. For example, digital signal modulation system 410 implements noise-shaping technology to shift noise frequencies in signal S2 out of preselected bandwidths and/or attenuate noise in one or more frequency bands.

For applications, such as audio applications, some embodiments of digital signal modulation system 410 may, for example, effectively shift otherwise audible noise in signal S2 into frequencies outside of human perceptible audio frequencies (i.e., generally above 20 kHz). In this way, the digital implementation of digital signal processing system 400 differs markedly from the analog implementation of the Stanley patent. In the digital implementation of digital signal processing system 400, a discrete set of output pulse widths are possible. The widths are generally quantized by the highest available clock frequency. The highest available digital resolution is generally insufficient for high quality audio. Noise shaping techniques are then utilized to bring the audio performance to a higher level. These problems differ greatly from the analog, continuous time case, in which noise shaping due to quantization is not necessary, as any possible width may theoretically be utilized.

Interleaving multiple output signals, such as $S_n'$ and $S_p'$, may result in noise due to, for example, mismatches between switching and post processing components. Thus, digital signal modulation system 410 may, for example, implement noise attenuation technology to generate one or more poles and zeros in a noise transfer function to attenuate noise in one or more audio frequency bands. An example of such noise attenuation technology is described in Melanson I.

The digital signal processing system 400 is implemented in a variety of ways. Several embodiments of digital signal processing system 400 and extended applications thereof are discussed below.

Figure 5:
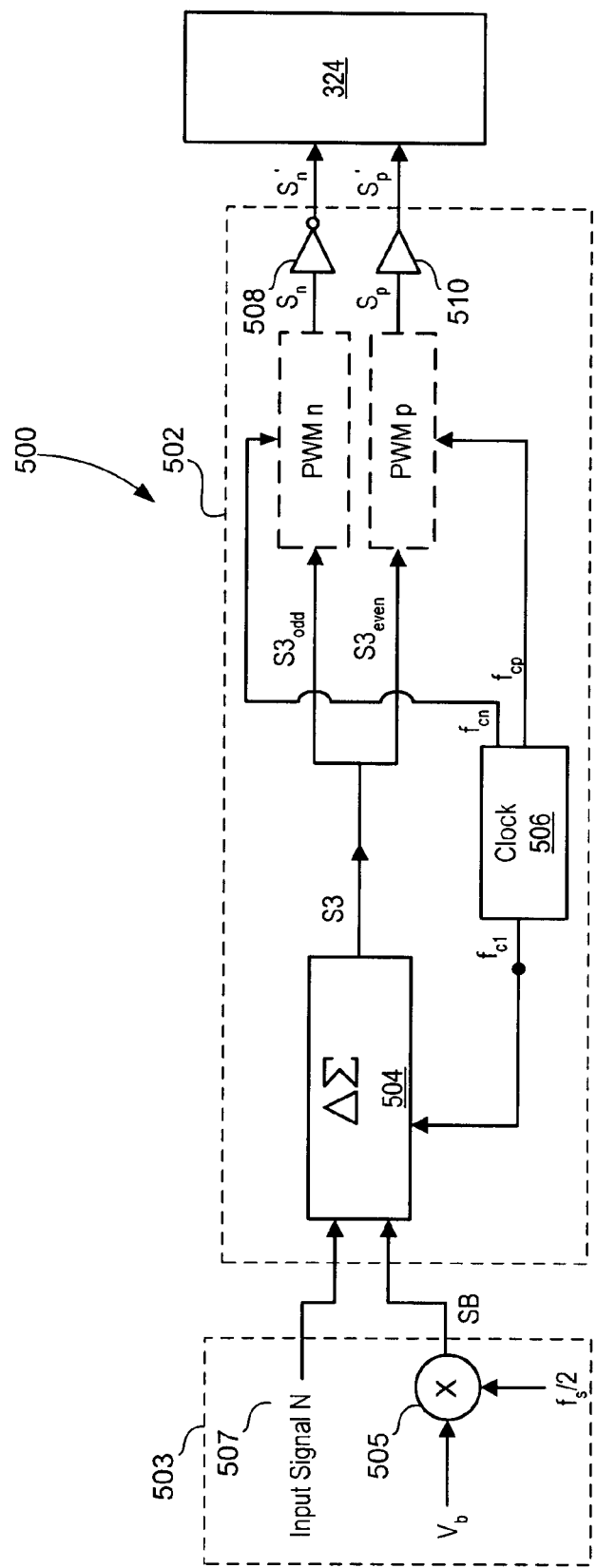
FIG. 5 depicts one embodiment of the digital signal processing system of FIG. 4.

FIG. 5 depicts digital signal processing system 500, which is one embodiment of digital signal processing system 400. The digital signal processing system 500 derives signals $S_n'$ and $S_p'$ from input signal N and a bias signal $V_b$. Signal generator 402 and optional pre- and post processing components are not shown for clarity but may be included in all digital signal processing system embodiments disclosed herein. Digital input signal N is sampled at frequency $f_s$ and, in one embodiment, is a 24 bit audio signal. As described above, input signal N is generally an interpolated version of a digital audio input signal. For high quality audio, a typical value for $f_s$ would be 768 kHz, or 16 times the standard 48 kHz sample rate. The digital signal processing system 500 utilizes bias processing system 500 to generate signal S1 from input signal N and bias signal $V_b$.

The bias processing system 406 of FIG. 4 may be implemented in a variety of ways, such as bias processing circuit 503. Bias processing circuit 503 multiplies bias signal $V_b$ and signal $f_s/2$. Signal $f_s/2$ alternates between logical values +1 and −1 at one half the sampling frequency, $f_s$, of input signal N. Thus, the output of multiplier 505 alternates between −$V_b$ and +$V_b$. Delta sigma modulators typically have a low pass signal transfer function that significantly rolls off at a frequency above the high end of the audio frequency bandwidth, approx. 20 kHz but before 384 kHz, the sampling frequency of $V_b$. Thus, in the embodiment of bias processing circuit 503, two respective input signals are provided to delta-sigma modulator 504, the relatively low frequency input signal N and the relatively high frequency bias signal $V_b$. The delta-sigma modulator 504 internally sums the bias signal $V_b$ with input signal N after the characteristic low pass filtering of input signal N. For conceptual purposes, this operation is equivalent to modulating a single input signal, S2, in which, $$S2 = \begin{cases} N + V_b & \text{for Even Samples of } N \\ N - V_b & \text{for Odd Samples of } N \end{cases} \quad \text{Equation 1}$$

The choice of which samples are represented by N+$V_b$ and N−$V_b$ is typically arbitrary, and those of ordinary skill in the art will recognize that other selection schemes may be utilized to generate the signals described herein. Also, the complement of a signal may also be referred to as the inverse of the signal.

The digital signal processing system 500 includes digital signal modulation system 502, which is one embodiment of digital signal modulation system 410. The digital signal modulation system 502 includes delta-sigma modulator 504 to provide the noise shaping properties of delta-sigma modulators, which are particularly useful for audio frequency signals. In one embodiment, the delta-sigma modulator 504 may be implemented to provide noise attenuation in one or more noise frequency bands as, for example, described in Melanson I. Clock 506 provides a clock signal frequency, $f_{cl}$, to the delta-sigma modulator 504 and modulates the biased input signal N into a series of multi-bit output signals S3. In this example, $f_{cl}=f_s=768$ kHz. Delta-sigma modulators are also often referred to as sigma-delta modulators.

PWMn processes the odd samples of signal S3, signal $S3_{odd}$, and PWMp processes the even samples of signal S3, signal $S3_{even}$. $S3_{odd}$ and $S3_{even}$ thus have an effective sampling rate of $f_{cl}/2$, which in one embodiment is 384 kHz. The odd and even samples of signal S3 are passed to pulse width modulator PWMn and PWMp, respectively. PWMn, in turn, modulates signal $S3_{odd}$ to produce one-bit drive signal $S_n$. Signal $S_n$ is inverted by inverter 508 to produce signal $S_n'$. Likewise, PWMp modulates signal $S3_{even}$ to produce one-bit drive signal $S_p$. A noninverting circuit 510 is connected between PWMp and load 324 to match the delay of inverter 508 and generate signal $S_p'$. Clock 506 provides clock signals with frequencies $f_{cn}$ and $f_{cp}$ to PWMn and PWMp, respectively, which provides signals $S_n'$ and $S_p'$ with a resolution of $f_{cn}/(f_{cl}/2)$ and $f_{cp}/(f_{cl}/2)$, respectively. A typical value for $f_{cn}$ and $f_{cp}$ is 49.152 MHz, which provides a $f_{cn}/(f_{cl}/2)=f_{cp}/(f_{cl}/2)$ ratio of 256.

Input signal N and the duty cycle of signal $S_n'$ are inversely proportional, i.e. as the magnitude of input signal N decreases, the pulse width of signal $S_n'$ increases and vice versa. Input signal N and the duty cycle of signal $S_p'$ are directly proportional, i.e. as the magnitude of input signal N increases, the pulse width of signal $S_n'$ increases and vice versa. Persons of ordinary skill in the art will recognize that digital signal modulation system 502 may substitute a different digital signal modulator for delta-sigma modulator 504 or directly modulate signal S3 into drive signals $S_n'$ and $S_p'$ using components appropriate for the topology of load 324, such as PWMn and PWMp alone.

U.S. Pat. No. 5,784,017, entitled Analogue and Digital Convertors Using Pulse Edge Modulators with Non-linearity Error Correction, inventor Peter Craven, (referred to herein as the "Craven patent") describes an example of pulse width modulation technology and error correction. In another embodiment of digital signal processing systems herein, PWMn and PWMp are implemented by the pulse width modulation technology of the Craven patent. The Craven patent is hereby incorporated by reference in its entirety.

Processing subsets of a signal with separate components generally cause concerns with respect to noise that may arise with any mismatching of offset and gain between separate signal paths (also commonly referred to as channels). In one embodiment, the odd samples of signal S3, $S3_{odd}$, propagate along a first signal path, and the even samples of signal S3, $S3_{even}$, propagate along a second signal path. Thus, in one embodiment, components along the path of signal $S3_{odd}$, such as PWMn, should be as closely matched as possible with the components along the path of signal $S3_{even}$, such as PWMp. One exemplary solution for minimizing noise caused by such mismatching is to insert zeros into the noise transfer function of the system as described in Melanson I.

Although digital signal processing system 500 may be used in many different applications, it is used to modulate an audio signal. Accordingly, Table 2 summarizes exemplary sampling and clock frequencies useful for audio applications (all of the frequencies having the same phase). One advantage of using frequencies with the same phase relationships is the confinement of $S_p'-S_n'$ LOW or HIGH transitions and, thus, Iout (FIG. 1) transitions to a single period.

TABLE 2

| Frequency Variable | Value |
| --- | --- |
| $f_s$ | 768 kHz |
| $f_{cl}$ | 768 kHz |
| | (i.e. 16 times $f_s$) |
| $f_s/2$ (Effective sampling frequency of $S3_{odd}$ and $S3_{even}$) | 384 kHz |
| $f_{cn}$ | 49.152 MHz |
| | (i.e. $2^7$ times $f_{cl}/2$ for 7 bit resolution) |
| $f_{cp}$ | 49.152 MHz |
| | (i.e. $2^7$ times $f_{cl}/2$ for 7 bit resolution) |

Figure 1:
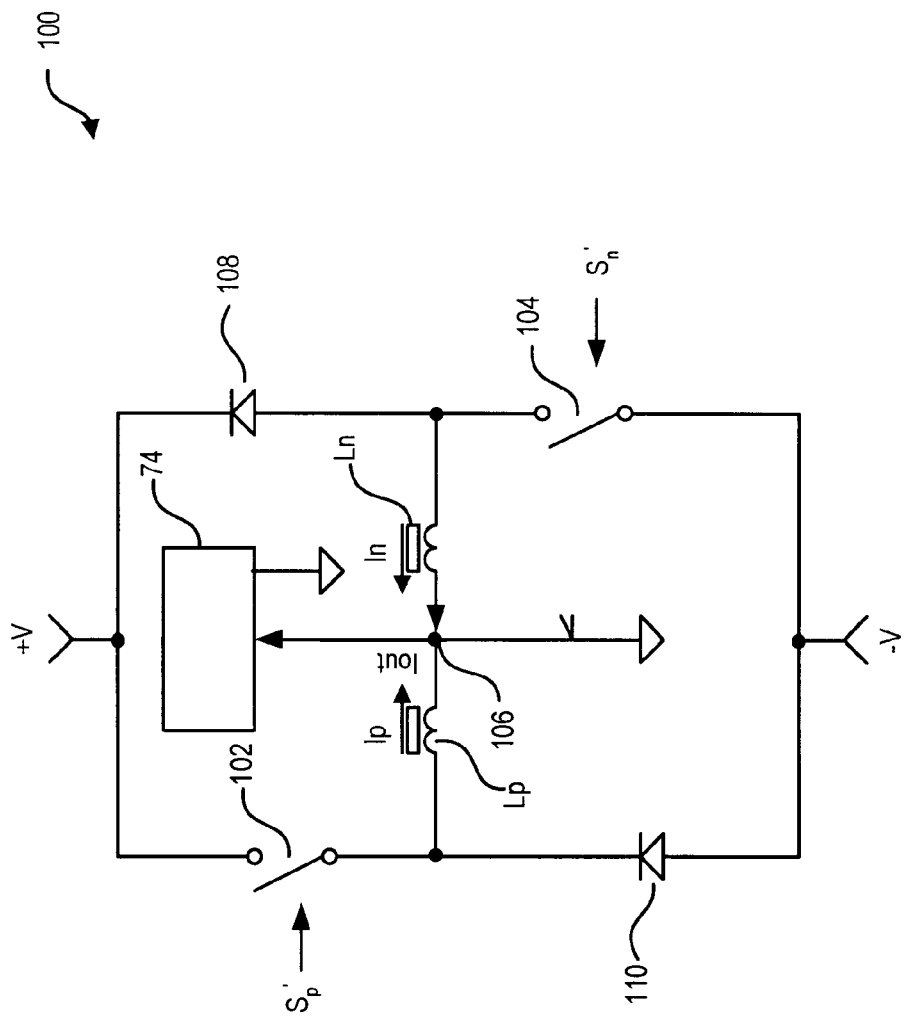
FIG. 1 (prior art) depicts an embodiment of an opposed current amplifier.
Figure 2:
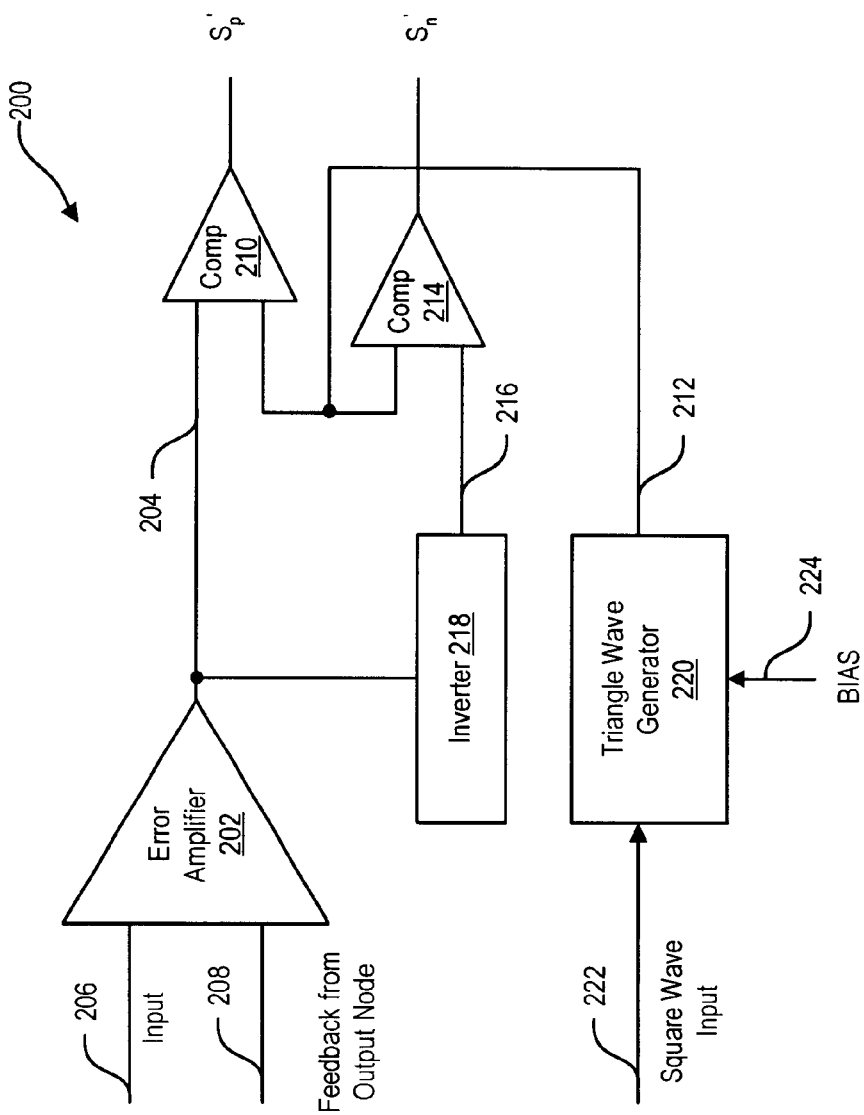
FIG. 2 (prior art) depicts a modulator for providing drive signals to the opposed current amplifier of FIG. 1.
Figure 3:
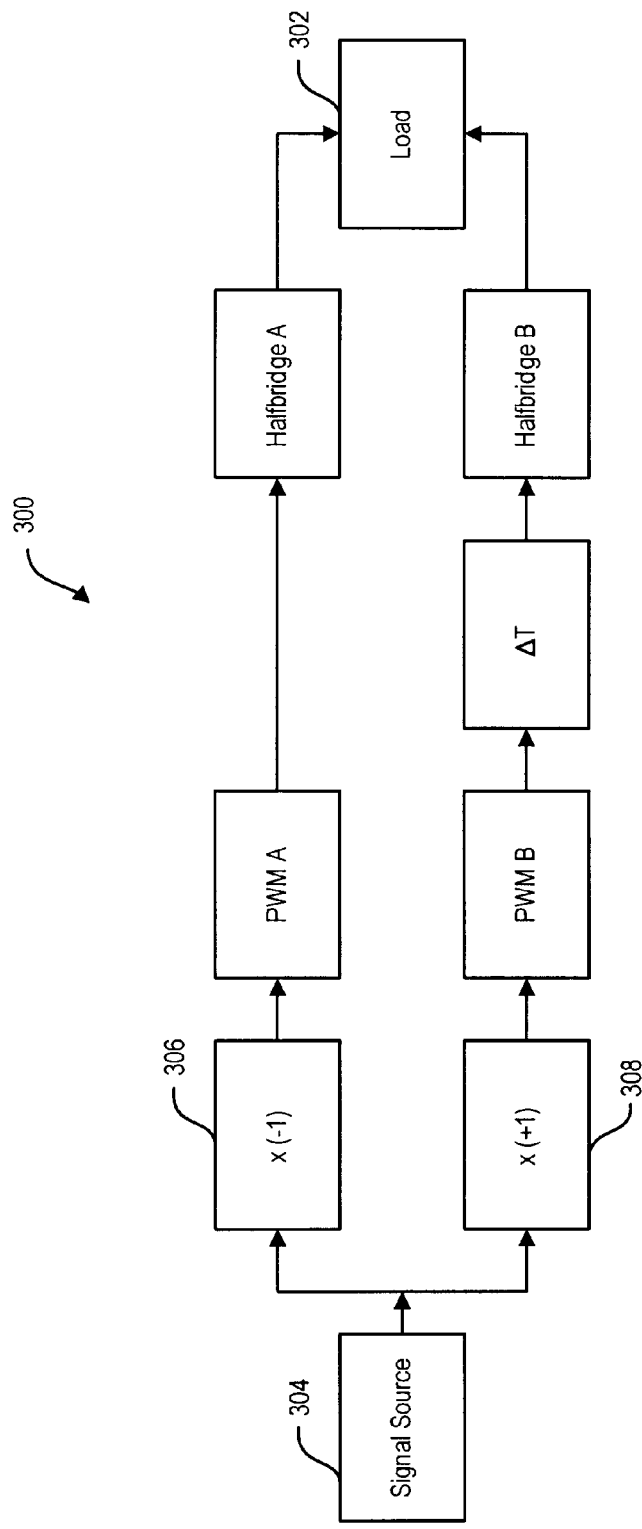
FIG. 3 (prior art) depicts a pair of modulators for providing signals to respective half bridge amplifiers.

Referring to FIGS. 1 and 5, for a load such as power converter circuit 100, the average Vout at node 106 during a period, T, is provided by Vout=Vsupply*(t+ minus t−)/T, where t− is the time during which $S_p'-S_n'$ is LOW (indicated by a "−" in the $S_p'-S_n'$ plot of FIG. 8), t+ is the time during which $S_p'-S_n'$ is HIGH (indicated by a "+" in the $S_p'-S_n'$ plot of FIG. 8), and T is one period of the PWMn and PWMp. The percentage of time for magnetization current in inductors Lp and Ln is 100($t_m-t_d$)/T, in which $t_m$ is the magnetization time during which $S_n'=S_p'$=HIGH (indicated by an "m" in the $S_p'-S_n'$ plot of FIG. 8), and td is the de-magnetization time during which $S_n'=S_p'$=LOW (indicated by a "d" in the $S_p'-S_n'$ plot of FIG. 6).

Figure 6A:
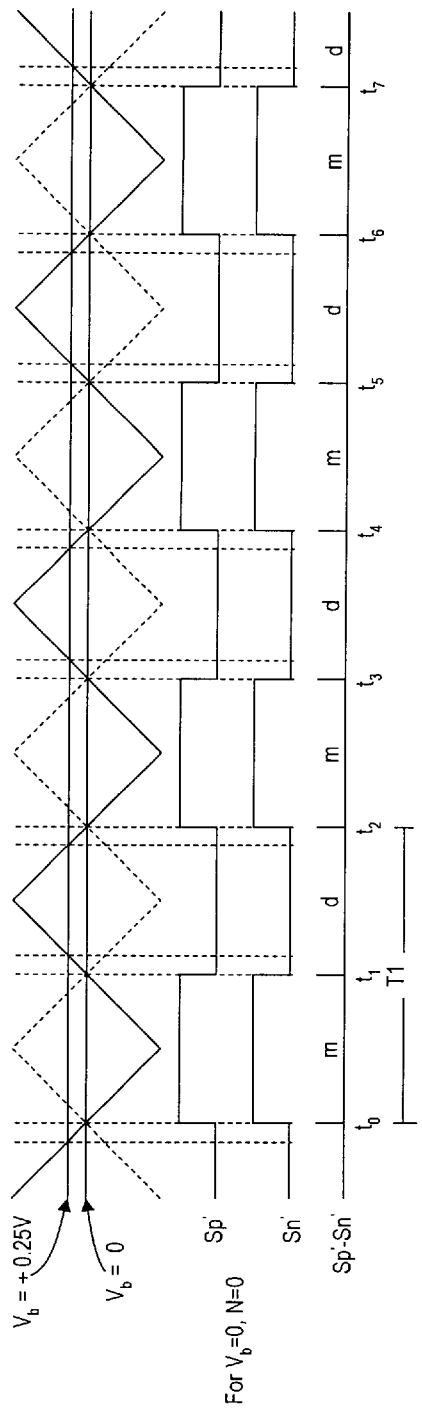
FIGS. 6A, 6B, 6C, and 6D depict examples of input and output signals from the digital signal processing system of FIG. 5 for various input and bias signal levels.

FIG. 6, consisting of FIGS. 6A, 6B, 6C, and 6D, depicts sample cycles of $S_p'$ and $S_n'$ as generated by digital signal processing system 500 in response to various levels of input signal N. The triangular waveforms of FIGS. 6 and 7 merely illustrate the periods of PWMs and assist in identifying $S_p'$ and $S_n'$ transitions. The triangular waveforms are not physically present in the systems depicted in the Figures. In addition, the quantization steps due to clocks $f_{c2}$ are not illustrated. Referring to FIG. 6A, the depiction of $S_p'$ minus $S_n'$ illustrates the manner in which digital signal processing system 600 processes a zero level input signal N and zero level bias signal $V_b$ to drive the four continuous current phases of power converter circuit 100 in accordance with Table 1. One period of PWMn and PWMp is represented by "T1". The time between t0 and t2 represents an exemplary period T. During the first half of period T1, $S_p'$ and $S_n'$ are HIGH, and during the second half of period T1, $S_p'$ and $S_n'$ are low. Thus, assuming digital signal processing system 500 is driving power converter circuit 100, at node 106, Vout_average=Vsupply*((t1−t0)−(t2−t1)=0 for N=bias signal $V_b$=0. As depicted in FIG. 6A, Vout_average remains at 0 as long as N=bias signal $V_b$=0.

Figure 6B:
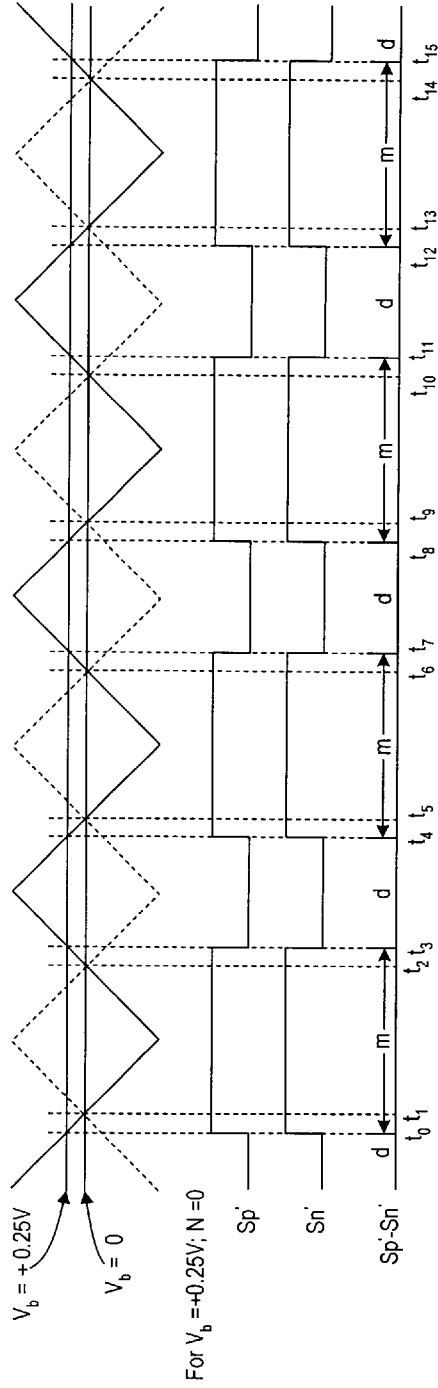

FIG. 6B illustrates one embodiment of utilizing digital signal processing system 500 to generate a nonzero Vout_average at node 106 while input signal N=0. As set forth in Equation 1, the odd samples of signal S3 are biased by $-V_b$, i.e., $V_b^*$ (−1), and the even samples are biased by $+V_b$, i.e., $V_b^*$ (+1). Since signal Sn, which is derived from signal $S3_{odd}$ samples, is inverted to generate signal $S_n'$, a positive bias signal $V_b$ increases the nominal pulse widths of $S_p'$ and $S_n'$. Thus, when N=0 and bias signal $V_b$ is positive, Vout_average is positive, i.e. Vout-average for T (e.g. t5−t1). A positive Vout_average indicates a longer magnetizing time, m, (e.g. (t3−t1)+(t5−t4)) for inductors Lp and Ln relative to the demagnetizing time, d, (e.g. t4−t3) during a period T1 for T. Conversely, a negative bias signal $V_b$ decreases the nominal pulse widths of $S_p'$ and $S_n'$ resulting in a negative Vout_average and a longer demagnetizing time of inductors Lp and Ln during a period T (not shown). Although FIGS. 6A and 6B depict bias signal $V_b$=+0.25V for demonstration purposes, bias signal $V_b$ is generally determined as discussed above. Again, the waveforms are illustrative, as the actual widths vary with noise shaping being active.

Figure 6C:
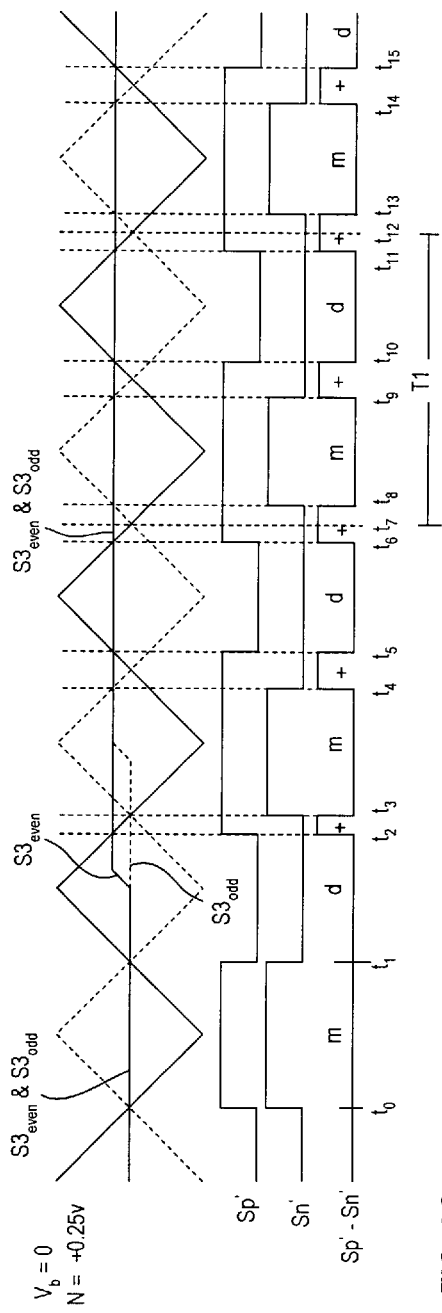

FIG. 6C illustrates the responsiveness of digital signal processing system 600 to positive changes in input signal N and concurrence with Table 1. Between t1 and t2, input signal $S3_{even}$ transitions with input signal N from 0 to +0.25 V, and input signal $S3_{odd}$ follows one-half period (−180°) later. The positive change in input signal N causes digital signal modulation system 502 to generate $S_n'$ with a net LOW duty cycle during each period, while input signal N is positive and bias signal $V_b$=0. Correspondingly, digital signal modulation system 502 generates $S_p'$ with a net HIGH duty cycle during each such period. For example, during period T1, $S_n'$ is LOW while $S_p'$ is HIGH for 0.625*T1, i.e. between t7 and t8, t9 and t10, and t11 and t12. During the remainder of T1 (i.e. 0.375*T1), $S_n'$ and $S_p'$ are both LOW. Thus, Vout_average for T1=Vsupply*(0.625−0.375)= 0.25*Vsupply. Thus, digital signal processing system 500 provides the appropriate levels of output signals $S_n'$ and $S_p'$ to drive load 324 to produce an output signal corresponding to the positive change in input signal N. Another pulse of the same duration as the net positive pulse between t2 and t3 accompanies a transition of input signal N from +0.25 to 0 V, which makes the total duty cycles of all periods for input signal N=+0.25 result in a Vout average=0.25*Vsupply.

Figure 6D:
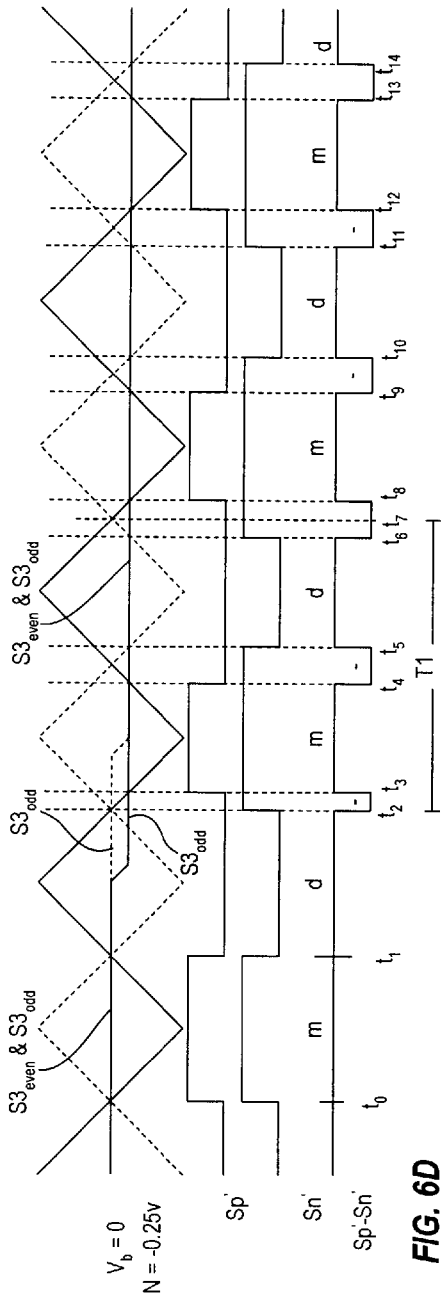

As a counterpart to FIGS. 6C, FIG. 6D illustrates the responsiveness of digital signal processing system 500 to negative changes in input signal N and concurrence with Table 1. Between t1 and t2, input signal $S3_{even}$ transitions with input signal N from 0 to −0.25 V, and input signal $S3_{odd}$ follows one-half period (−180°) later. The negative change in input signal N causes digital signal modulation system 502 to generate $S_n'$ with a net HIGH duty cycle during each period, while input signal N is negative and bias signal $V_b$=0. Correspondingly, digital signal modulation system 502 generates $S_p'$ with a net LOW duty cycle during each such period. For example, during period T1, $S_n'$ is HIGH while $S_p'$ is LOW for 0.625*T1, i.e. between t2 and t3, t4 and t5, and t6 and t7. During the remainder of T1 (i.e. 0.375*T1), $S_n'$ and $S_p'$ are both HIGH. Thus, Vout_average for T1=Vsupply*(0.375−0.625)=−0.25*Vsupply. Thus, digital signal processing system 600 provides the appropriate levels of output signals $S_n'$ and $S_p'$ to drive load 324 to produce an output signal corresponding to the negative change in input signal N.

Figure 7:
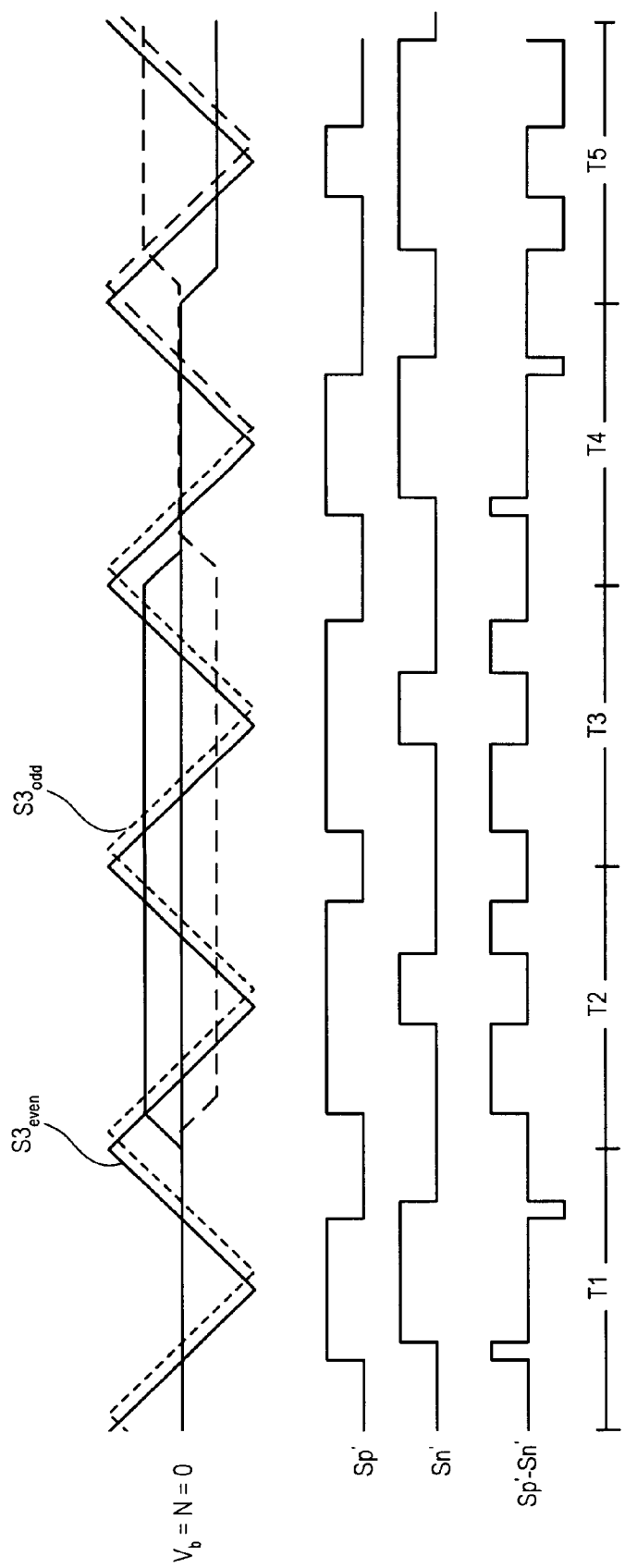
FIG. 7 depicts another example of input and output signals from the digital signal processing system of FIG. 4.

FIG. 7 further illustrates the ability of digital signal processing system 500 to successfully implement the four continuous current states of Table 1 using phase shifted clock frequencies. Signals $S_p'$ and $S_n'$ are generated by digital signal processing system 500 using the frequencies and phase relationships as set forth in Table 3.

TABLE 3

| Frequency Variable | Value | Phase |
| --- | --- | --- |
| $f_s$ | 48 kHz | 0° |
| $f_{c1}$ | 384 kHz (i.e. 8 times $f_s$) | 0° |
| $f_{cn}$ | 49.152 MHz (i.e. $2^7$ times $f_{c1}$ for 7 bit resolution) | −22.5° |
| $f_{cp}$ | 49.152 MHz (i.e. $2^7$ times $f_{c3}$ for 7 bit resolution) | 0° |

In FIG. 7, bias signal $V_b$ equals zero, and input signal N transitions as follows: from 0 to +0.5 V in period T2, from +0.5 V to 0 in period T4, and from 0 to −0.5 V in period T5. Summing the negative and positive transitions of $S_p'$−$S_n'$ during period T1, T2, T3, T4, and T5 yields the values in Table 4 for Vout_average when driving power converter circuit 100 with digital signal processing system 500:

TABLE 4

| Period | Vout_average (volts) |
| --- | --- |
| T1 | 0 |
| T2 | +0.5 * Vsupply |
| T3 | +0.5 * Vsupply |
| T4 | 0 |
| T5 | −0.5 * Vsupply |

Vout average=0 for T1, and Vout average=+0.50 for T2. Equivalent Vout averages are achieved regardless of the phase shift between the clock frequencies of PWMn and PWMp.

Figure 8:
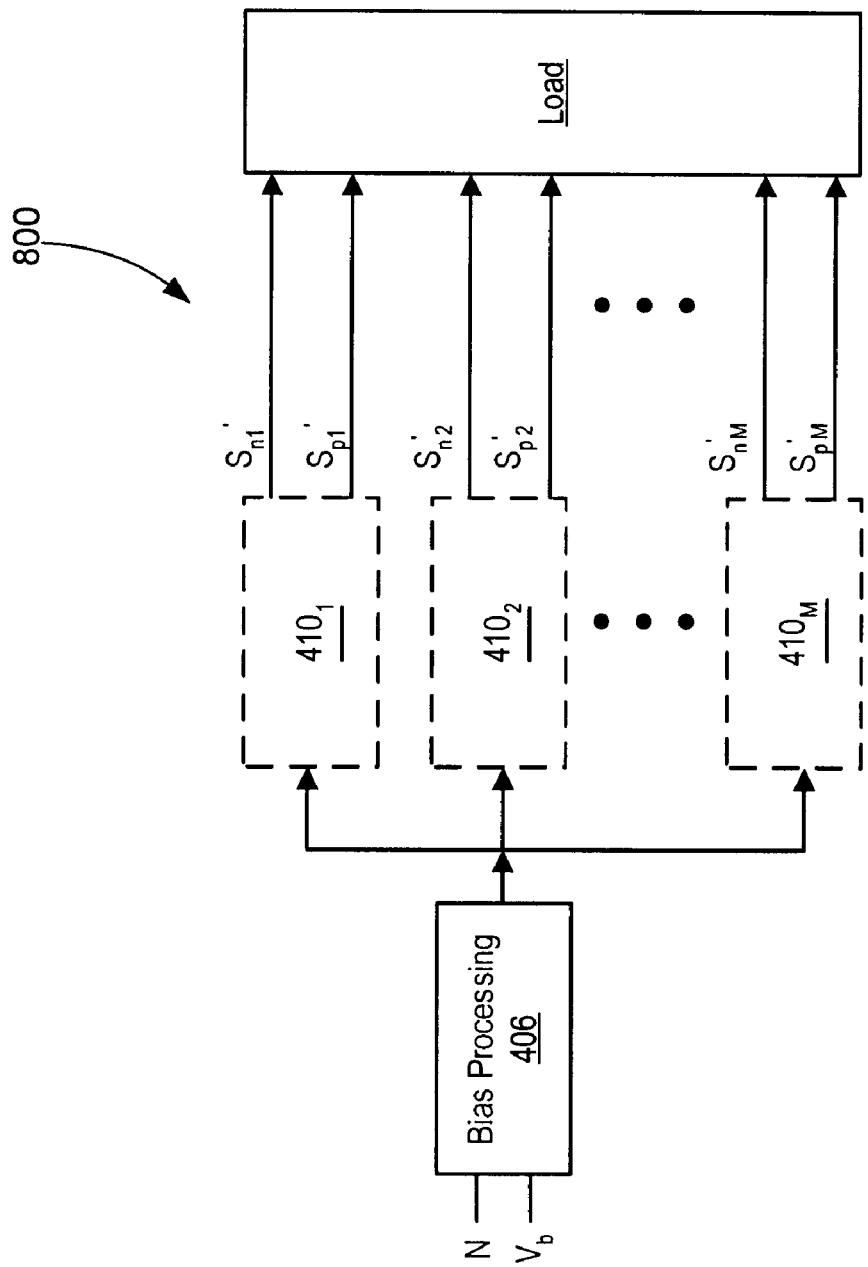
FIG. 8 depicts an embodiment of the digital signal processing system of FIG. 4 using M digital modulators, where M is an integer greater than one.
Figure 9:
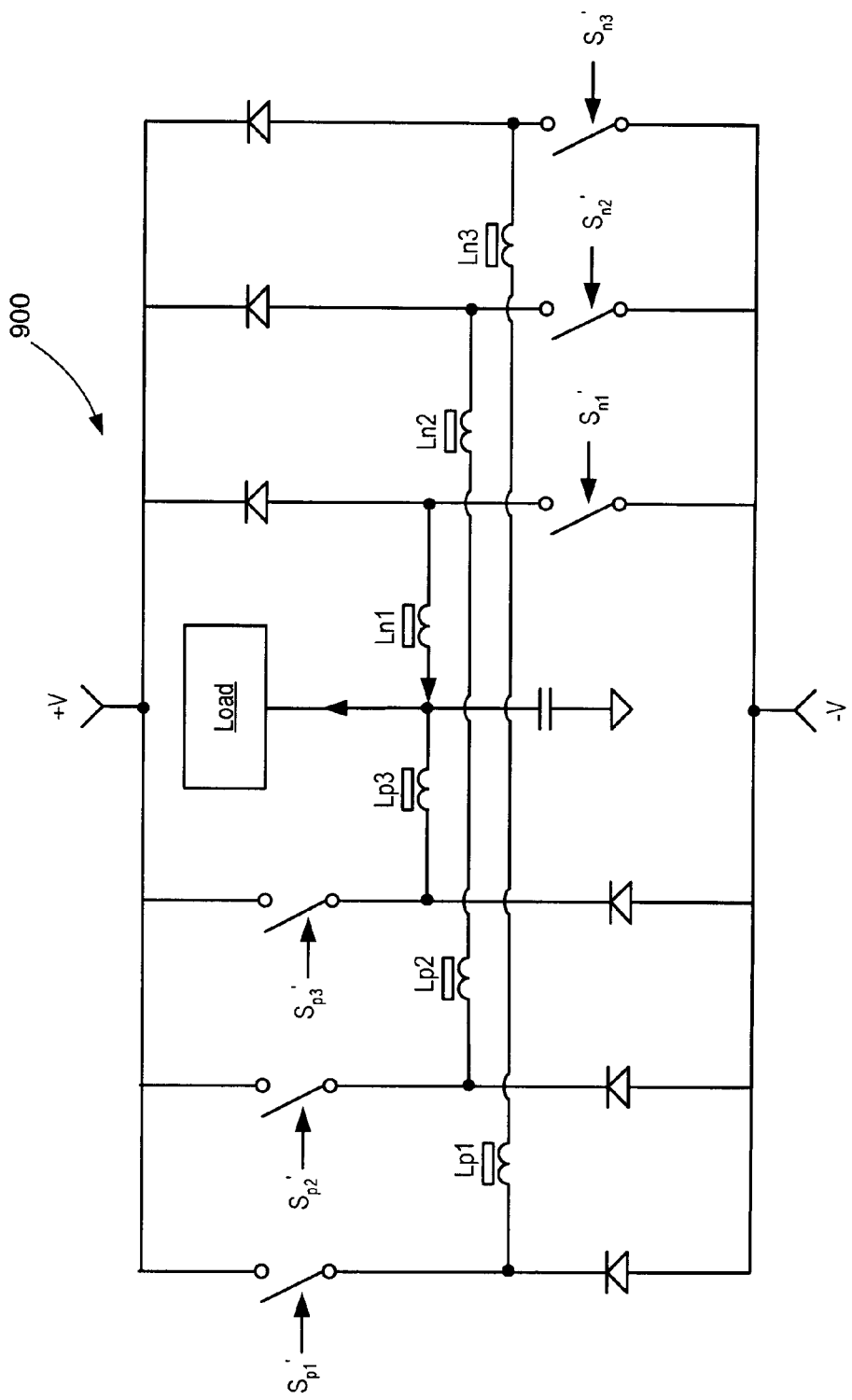
FIG. 9 depicts a three phase, half bridge opposed current amplifier for use with the digital signal processing system of FIG. 8.

FIG. 8 depicts digital signal processing system 800, which is an extended application of an embodiment of the digital signal processing system 400. Digital signal processing system 800 uses M digital signal modulation systems 410, in which M is an integer greater than one. The M digital signal modulation systems 410[1:M] are each implemented using digital signal modulation system 502. (The notation "[1:M]" represents "1 through M"). Thus, digital signal modulation systems 410[1:M] modulate input signal N into 2*M output signals $S_{nM}'$ and $S_{pM}'$. For example, if M=3, the three digital modulators, such as three delta-sigma modulators 504, generating $S_3$ are clocked with frequencies 120° apart, then digital signal processing system 800 drives a three phase OCC 900 as illustrated in FIG. 9. This set-up further reduces the ripple current in the load and decreases sensitivity to clock jitter.

Figure 10:
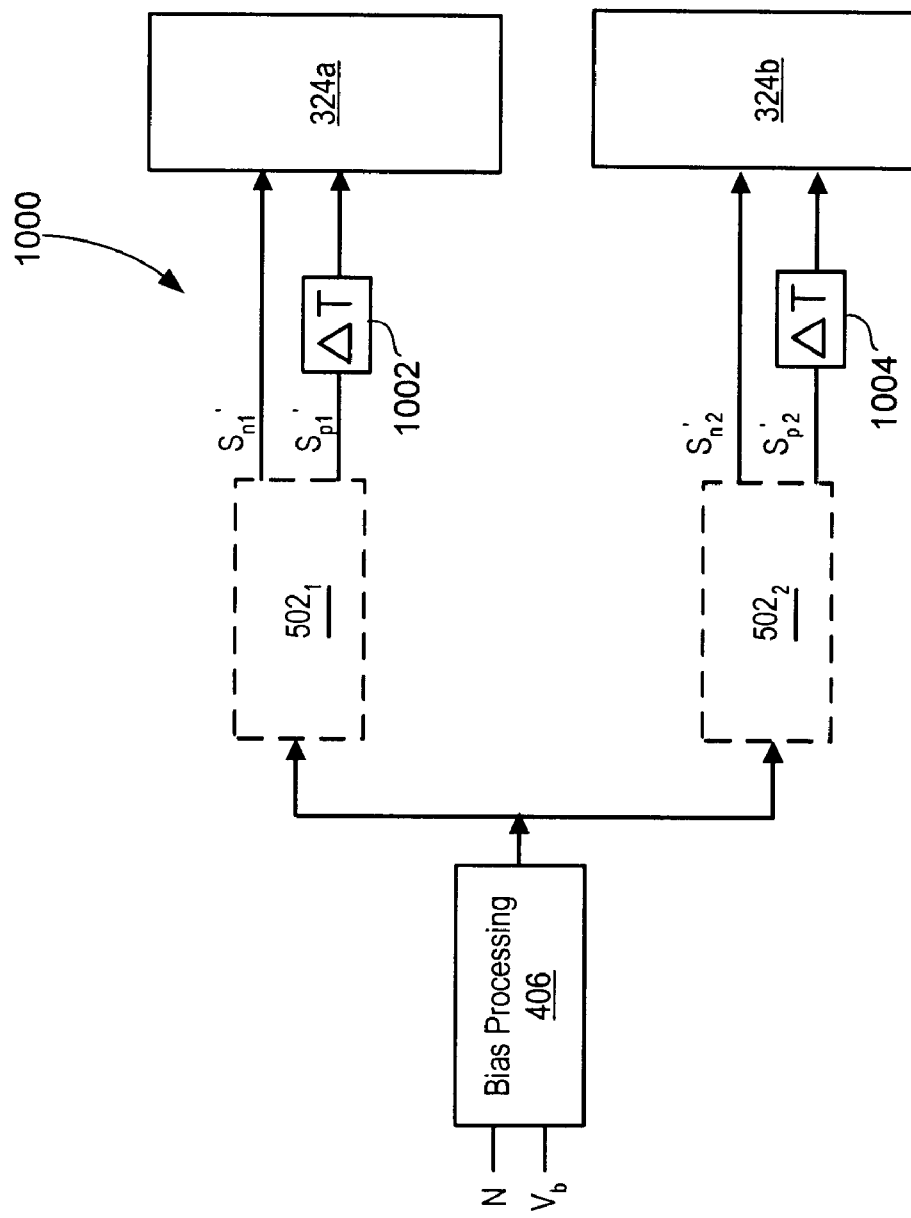
FIG. 10 depicts an embodiment of the digital signal processing system of FIG. 4 using a pair of digital modulators and signal delay elements.

FIG. 10 depicts digital signal processing system 1000, which is another embodiment of digital signal processing system 500. Digital signal processing system 1000 utilizes two digital signal processing systems 500, with the respective systems designated using "1" and "2" subscripts. However, output signals $S_{p1}'$ and $S_{p2}'$ are delayed by delay elements 1002 and 1004, respectively. Delay elements 1002 and 1004 operate as the delay elements described in the Anderskouv-Risbo patent to reduce cross-over distortion between loads 324a and 324b in the audio frequency band. Loads 324a and 324b are, for example, embodiments of power converter circuit 100.

The signal processing systems disclosed herein may be manufactured using well-known integrated, discrete, or a combination of integrated and discrete components. Those of ordinary skill in the art will recognize that the signal processing systems disclosed herein may be implemented with a wide range of components other than those disclosed herein. For example, the digital signal modulators could be implemented using mixed signal (analog and digital) technology.

Although the present invention has been described in detail, it should be understood that various changes, substitutions and alterations may be made hereto without departing from the spirit and scope of the invention as defined by the appended claims. For example, applications of the signal processing systems described herein are not limited to audio applications.

What is claimed is:

1. An apparatus comprising:
   a first digital signal modulator to generate a first modulated output signal derived from a digital input signal; and
   first duty cycle circuitry, coupled to the first digital signal modulator, to receive first and second input signals, which are respective subsets of samples of the first modulated output signal, wherein the first duty cycle circuitry responds to the first and second input signals and respectively generates a first output signal and a second output signal;
   wherein during operation of the first digital signal modulator and the first duty cycle circuitry, a duty cycle of the first output signal has a direct relationship to change in the digital input signal, a duty cycle of the second output signal has an inverse relationship to change in the digital input signal, and the first and second output signals are suitable for driving an opposed current converter stage.

2. The apparatus of claim 1 further comprising:
   biasing circuitry to positively bias approximately one-half of samples of the digital input signal and to negatively bias a remainder of the digital input signal samples when a bias signal is nonzero.

3. The apparatus of claim 2 wherein the digital input signal is sampled a frequency, $f_s$, the biasing circuitry further comprises:
   a multiplier having (i) inputs to receive the bias signal $V_b$ and a waveform having a frequency of $f_s/2$ and (ii) circuitry to multiply $V_b$ and the waveform to alternately generate $V_b$ and minus $V_b$; and
   wherein the first modulated output signal is derived from the digital input signal and bias signal $V_b$.

4. The apparatus of claim 3 wherein the digital input signal and bias signal $V_b$ are separately received by the first digital signal modulator.

5. The apparatus of claim 2 wherein the first and second output signals of the duty cycle circuitry have approximately equal duty cycles when the first and second input signals are equal and the bias signal is zero.

6. The apparatus of claim 1 further comprising:
   a delay element, coupled to an output of the circuitry, to delay the first output signal relative to the second output signal.

7. The apparatus of claim 5 further comprising:
   a second digital signal modulator to generate a second modulated output signal derived from the digital input signal;
   second duty cycle circuitry, coupled to the second digital signal modulator, to receive third and fourth input signals, which are respective subsets of samples of the second modulated output signal, wherein the second duty cycle circuitry responds to the third and fourth input signals and respectively generates a third output signal and a fourth output signal;
   wherein during operation of the second digital modulator and the second duty cycle circuitry, a duty cycle of the third output signal has a direct relationship to change in the digital input signal, a duty cycle of the fourth output signal has an inverse relationship to change in the digital input signal, and the third and fourth output signals are suitable for driving an opposed current converter stage;
   a first amplifier having a first switch, coupled between a first voltage source and a load, with a control terminal to receive the first output signal and having a second switch, coupled between a second voltage source and the load, with a control terminal to receive the second output signal; and
   a second amplifier having a first switch, coupled between the first voltage source and the load, with a control terminal to receive the third output signal and having a second switch, coupled between the second voltage source and the load, with a control terminal to receive the fourth output signal.

8. The apparatus of claim 1 wherein:
   the first output signal is operable to control a first switch;
   the second output signal is operable to control a second switch; and
   a duty cycle of the first switch has an inverse relationship to a duty cycle of the second switch if the digital input signal has a non-zero magnitude.

9. The apparatus of claim 8 wherein the change in the digital input signal comprises a change in magnitude of the digital input signal.

10. The apparatus of claim 1 further comprising:
    an analog output stage coupled to the first duty cycle circuitry and having (i) respective inputs to receive the first and second output signals, and (ii) circuitry to convert the first and second output signals into a single analog output signal.

11. The apparatus of claim 10 wherein the analog output stage comprises an opposed current converter circuit, wherein the opposed current converter circuit comprises:
    a positive current control switch to receive the first output signal;
    a negative current control switch to receive the second output signal; and
    an output terminal coupled between the positive current control switch and the negative current control switch for supplying current to a load.

12. The apparatus of claim 1 wherein:
    the first digital signal modulator comprises a delta-sigma modulator to receive and process the first digital input signal;

the first duty cycle circuitry further comprises (i) a first duty cycle demodulator to process alternate samples of the first modulated output signal and (ii) a second duty cycle demodulator to process samples of the first modulated output signal not processed by the first duty cycle demodulator.

13. The apparatus as in claim 12 wherein the first and second duty cycle demodulators respectively include first and second pulse width modulators.

14. The apparatus of claim 12 further comprising:

a clock to provide interleaved clock signals to the first and second duty cycle demodulators.

15. The apparatus of claim 1 wherein the first digital signal modulator includes noise-shaping capabilities to reduce audio frequency noise.

16. The apparatus of claim 1 wherein the digital input signal is an audio signal.

17. The apparatus of claim 1 further comprising:

M sets of the first digital signal modulator, each having an input to receive the first digital input signal and an output to provide a modulated output signal; and M sets of the first duty cycle modulator coupled to an associated set of the M first digital signal modulators, each having an input to receive the output signal of the associated M first circuitry and outputs to provide multiple output signals;

wherein M is a positive integer greater than 1.

18. A digital to analog converter system comprising:

a first modulator having an input to receive a digital input signals derived from a common input signal and a bias signal and an output to provide a first modulated signal, wherein the first modulated signal is comprised of a first and second group of signals;

a first duty cycle modulator coupled to the first modulator to receive the first group of signals and generate output signals corresponding to the first group of signals; and a second duty cycle modulator coupled to the first modulator to receive the second group of signals and generate output signals corresponding to the second group signals.

19. The digital to analog converter system of claim 18 further comprising:

an analog output stage coupled to the duty cycle modulators and having a first input to receive the output signals from the first duty cycle modulator, a second input to receive the output signals from the second duty cycle modulator, and circuitry to convert the received output signals into a drive signal that provides current to a load.

20. The digital to analog converter system of claim 19 wherein the analog output stage is an opposed current power converter circuit.

21. The digital to analog converter system of claim 18 wherein the first group of the digital input signals is derived from the common input signal and a positive version of the bias signal and the second group of the digital input signals is derived from the common input signal and a positive version of the bias signal.

22. The digital to analog converter system of claim 21 wherein the first group of the digital input signals consists of even numbered digital input signals and the second group of the digital input signals consists of odd numbered digital input signals.

23. The digital to analog converter system of claim 18 wherein:

the first modulator includes a delta-sigma modulator;

the first duty cycle modulator includes a pulse width modulator; and the second duty cycle modulator includes another pulse width modulator.

24. The digital to analog converter system of claim 18 further comprising:

M additional duty cycle modulators coupled to the first modulator, wherein the $Y^{th}$ duty cycle modulator receives the $Y^{th}$ group of the M signals and generates output signals corresponding to the $Y^{th}$ group of the M signals, wherein M is an integer greater than 2 and Y is an integer ranging from 3 through M.

25. An apparatus comprising:

means for generating a first digital input signal from a common input signal and a first bias signal and for generating a second digital input signal from the common input signal and a second bias signal;

means for (i) modulating the first digital input signal, coupled to the means for generating the first and second digital input signals, to generate N modulated first output signals, wherein N is a positive integer and (ii) modulating the second digital input signal to generate N modulated second output signals;

means for providing (i) the first output signals to first circuitry and (ii) the second output signals to second circuitry; and means for converting the N and M modulated output signals into a drive signal.

26. The apparatus of claim 25 wherein the means for converting comprises an opposed current converter.

27. The apparatus of claim 25 wherein the first and second bias signals are arithmetic complements.

28. A method of providing multiple output drive signals derived from a common input signal, the method comprising:

receiving a common digital input signal and a first digital bias signal;

converting the common digital input signal and the first digital bias signal into a first output signal using a first modulator;

receiving the common digital input signal and a second digital bias signal;

converting the common digital input signal and the second digital bias signal into a second output signal using the first modulator; and providing the first and second output signals to circuitry operable to derive a drive signal from the first and second output signals.

29. The method of claim 28 wherein:

converting the common digital input signal and the first digital bias signal comprises modulating the first digital input signal with a delta-sigma modulator to generate a first delta-sigma output signal;

converting the common digital input signal and the second digital bias signal comprises modulating the second digital input signal with the delta-sigma modulator to generate a second delta-sigma output signal; and providing the first and second output signals to circuitry operable to derive a drive signal comprises:

providing the first output signal to a first duty cycle modulator and providing an output signal of the first duty cycle modulator to an opposed current converter; and providing the second output signal to a second duty cycle modulator and providing an output signal of the second duty cycle modulator to the opposed current converter.

30. The method of claim 28 further comprising:

utilizing the first and second output signals to cause an opposed current converter to provide the drive signal as an output signal.

31. The method of claim 28 wherein the common digital input signal is sampled at a frequency $f_s$, the method further comprising:

multiplying a digital bias signal times a signal oscillating between logical +1 and −1 at a frequency of $f_s/2$;

generating the first digital bias signal from the digital biasing signal times logical +1; and generating the second digital bias signal from the digital biasing signal times logical −1.

32. The method of claim 28 further comprising:

shaping noise frequencies of the first and second output signals.

33. The method of claim 32 wherein shaping noise frequencies comprises locating noise frequencies outside of audio frequencies.

34. The method of claim 28 wherein the first and second output signals are approximately in-phase when the common digital input signal plus the first digital equals the common digital input signal plus the second digital bias signal.

35. The method of claim 28 wherein the first and second digital bias signals are arithmetic complements.

36. The method of claim 28 further comprising:

inverting the second output signal.

37. The method of claim 28 wherein the first output signal is derived from even samples of the common input signal and the second output signal is derived from odd samples of the common input signal.

38. The method of claim 28 further comprising:

converting the common digital input signal and the first digital bias signal into N additional output signals using N modulators, wherein N is a positive integer;

converting the common digital input signal and a second digital bias signal into M additional output signals using M modulators, wherein M is a positive integer; and converting the first and second output signals and the N and M additional output signals into drive signals.

39. The method of claim 28 wherein the circuitry includes a half bridge opposed current converter.

40. A method of providing multiple output signals derived from a common digital input signal, the method comprising:

generating first output signals derived from the digital input signal using a first digital signal modulator;

providing a first group of the first output signals to circuitry for processing the first output signals into signals suitable for driving circuitry in an opposed current converter stage; and providing a second group of the first output signals to circuitry for processing the first output signals into signals suitable for driving circuitry in the opposed current converter stage;

wherein the first output signals have a direct relationship to change in the digital input signal and the second output signals have an inverse relationship to change in the digital input signal.

41. The method of claim 40 wherein:

generating the first output signals comprises modulating the digital input signal using a delta-sigma modulator;

providing the first group of the first output signals comprises providing even numbers of the first output signals to first duty cycle modulation circuitry; and providing the first group of the first output signals comprises providing odd numbers of the first output signals to second duty cycle modulation circuitry.

\* \* \* \* \*